United States Patent
Kraus et al.

(12) 
(10) Patent No.: US 6,587,979 B1
(45) Date of Patent: Jul. 1, 2003

(54) PARTITIONABLE EMBEDDED CIRCUIT TEST SYSTEM FOR INTEGRATED CIRCUIT

(75) Inventors: Lawrence Kraus, San Jose, CA (US); Ivan-Pierre Batinic, San Martin, CA (US); Marc P. Loranger, Livermore, CA (US); Hiralal Ranga, Palo Alto, CA (US)

(73) Assignee: Credence Systems Corporation, Fremont, CA (US)

( * ) Notice: Subject to any disclaimer, the term of this patent is extended or adjusted under 35 U.S.C. 154(b) by 0 days.

(21) Appl. No.: 09/494,824

(22) Filed: Jan. 31, 2000

Related U.S. Application Data

(60) Provisional application No. 60/160,233, filed on Oct. 18, 1999.

(51) Int. Cl.[7] .............................................. G11C 29/00
(52) U.S. Cl. ..................................... 714/720; 714/702
(58) Field of Search ................................... 714/720, 702

(56) References Cited

U.S. PATENT DOCUMENTS

| | | | | |
|---|---|---|---|---|
| 4,873,705 A | * | 10/1989 | Johnson ...................... 714/719 |
| 5,271,019 A | * | 12/1993 | Edwards et al. ............ 714/730 |
| 5,375,091 A | * | 12/1994 | Berry et al. ................. 365/201 |
| 5,471,482 A | * | 11/1995 | Byers et al. ................ 714/719 |
| 5,473,616 A | * | 12/1995 | Tsutsui et al. .............. 714/712 |
| 5,506,499 A | * | 4/1996 | Puar ........................ 324/158.1 |
| 5,535,164 A | * | 7/1996 | Adams et al. ............... 365/201 |
| 5,592,616 A | * | 1/1997 | Finch et al. .................... 714/42 |
| 5,708,773 A | * | 1/1998 | Jeppesen et al. ............... 714/30 |
| H1741 H | * | 7/1998 | Cruts ......................... 714/720 |
| 5,854,796 A | * | 12/1998 | Sato ........................... 714/718 |
| 6,029,262 A | * | 2/2000 | Medd et al. ................. 714/724 |
| 6,065,141 A | * | 5/2000 | Kitagawa ..................... 714/711 |
| 6,067,262 A | * | 5/2000 | Irrinki et al. ................. 365/201 |
| 6,072,737 A | * | 6/2000 | Morgan et al. .............. 365/201 |
| 6,085,334 A | * | 7/2000 | Giles et al. ..................... 714/7 |
| 6,088,823 A | * | 7/2000 | Ayres et al. ................. 714/733 |
| 6,182,257 B1 | * | 1/2001 | Gillingham .................. 714/733 |
| 6,286,115 B1 | * | 9/2001 | Stubbs ........................ 714/718 |
| 6,304,989 B1 | * | 10/2001 | Kraus et al. ................. 714/733 |
| 6,311,299 B1 | * | 10/2001 | Bunker ........................ 714/719 |
| 6,317,846 B1 | * | 11/2001 | Higgins et al. ................ 714/30 |
| 6,367,042 B1 | * | 4/2002 | Phan et al. .................. 714/733 |
| 6,374,377 B1 | * | 4/2002 | Guddat et al. .............. 714/718 |

* cited by examiner

*Primary Examiner*—Albert Decady
*Assistant Examiner*—Joseph D. Torres
(74) *Attorney, Agent, or Firm*—Daniel J. Bedell; Smith-Hill and Bedell

(57) ABSTRACT

A flexible built-in self-test (BIST) circuit is incorporated into an integrated circuit (IC) for testing one or random access memories or other memories embedded in an integrated circuit regardless of the number, size or test requirements of the memories. Input data from a controller that may be conveniently partitioned among components internal and external to the IC, supplies data to the BIST circuit indicating the size of the embedded memories to be tested and selecting from among several modes of BIST operation.

16 Claims, 10 Drawing Sheets

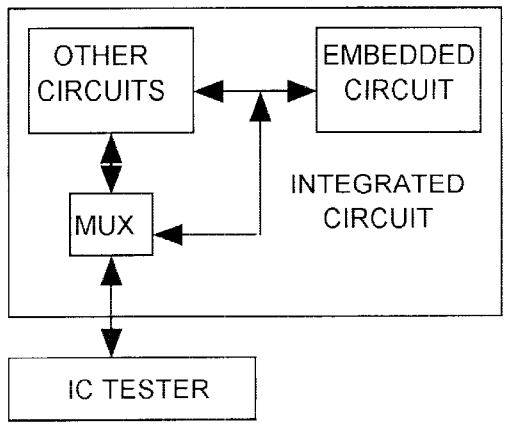
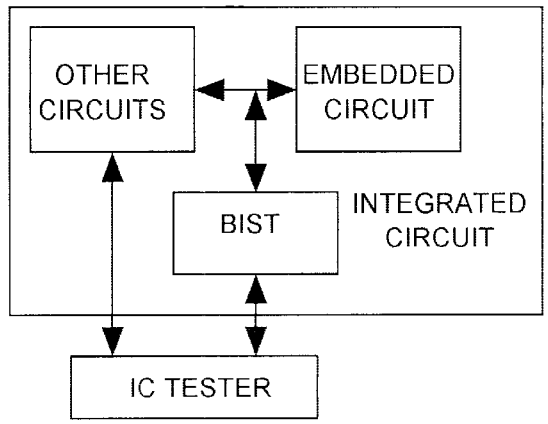
FIG. 1
(PRIOR ART)
FIG. 2
(PRIOR ART)
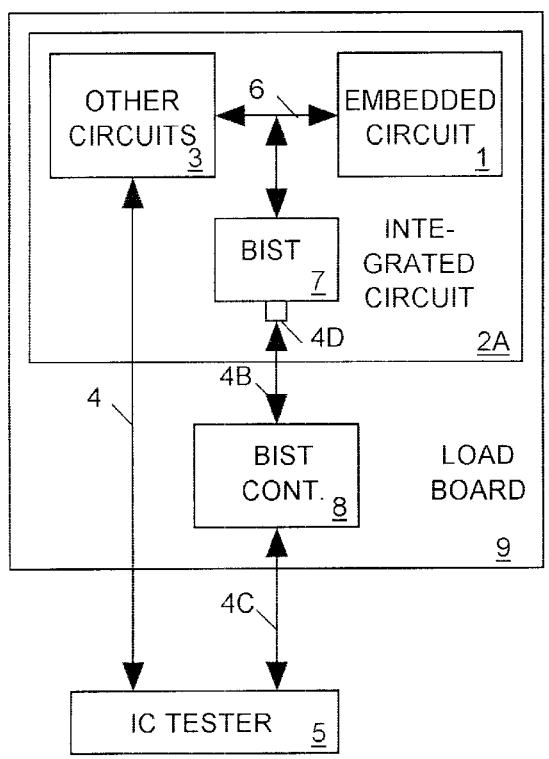
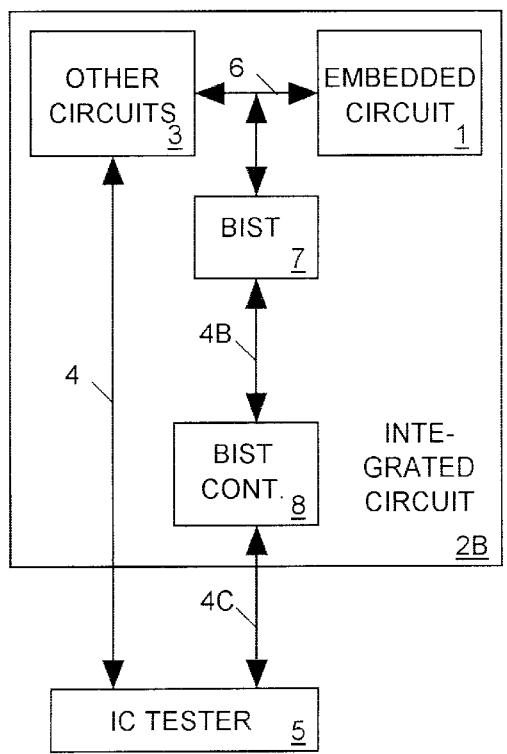
FIG. 3A
FIG. 3B

US 6,587,979 B1

PARTITIONABLE EMBEDDED CIRCUIT TEST SYSTEM FOR INTEGRATED CIRCUIT

CROSS-REFERENCE TO RELATED APPLICATION

This application claims benefit of Provisional Application No. 60/160,233 filed Oct. 18, 1999. The entire disclosure of Provisional Application No. 60/160,233 is hereby incorporated by reference herein.

BACKGROUND OF THE INVENTION

1. Field of the Invention

The present invention relates in general to a system for testing circuits embedded in an integrated circuit (IC), and in particular to a system that may be flexibly partitioned between components internal and external to the IC.

2. Description of Related Art

Many integrated circuits (ICs) include one or more embedded circuits such as random access memories (RAMs). While logic circuits implemented in an IC itself may read or write access an embedded RAM, the bus conveying data, address and control signals between the RAM and the logic circuits read and write accessing it may not be accessible to external test equipment via the IC's input/output (I/O) terminals. Conventional IC testers external to the IC therefore can't directly test such an embedded RAM.

One way to allow an external IC tester to test an embedded RAM is to link the RAM's I/O ports to the IC's I/O terminals. However this approach requires a large number of extra I/O terminals to accommodate the RAM's I/O ports and can require a substantial amount of scarce space within the IC to route large buses between each embedded RAM and the IC's I/O terminals. Another way to allow provide a IC tester with access to terminals of an embedded RAM or other circuit is multiplex its terminals onto I/O terminals of other circuits so that an IC tester can selectively access the embedded circuit terminals as illustrated in FIG. 1. This approach can eliminate the need for extra I/O terminals, but can still require substantial amounts of IC space for routing the large embedded memory buses.

FIG. 2 illustrates a third approach to providing an IC tester with access to an embedded circuit. A "built-in self-test" (BIST) circuit is formed on the IC that is designed to test the embedded circuit. A BIST circuit may require relatively few connections to the IC's I/O terminals for communicating with external test circuits. Thus when the BIST circuit is located proximate to the RAM or RAMs it tests, signal routing paths between the BIST circuit and the I/O terminals can require less space on the IC than would be required if the RAMs' I/O ports were directly routed to the IC's I/O terminals. The number and nature of the connections between the BIST circuit and the IC's I/O terminals depend on the nature of the test to be performed and on how test functions are apportioned between the IC's internal BIST circuit and equipment external to the IC that communicates with the BIST circuit. For example a self-contained BIST circuit carrying out all aspects of a simple pass/fail test may require only a START signal input to initiate the test, a DONE signal output to indicate the test is complete, and a PASS/FAIL signal output to indicate the results of a test. When the BIST circuit requires an external controller providing timing signals for sequencing address and data generation, additional IC I/O ports are needed to supply those timing signals to the BIST circuit. Also more I/O terminal connections may be needed when the BIST circuit is to report the address of each defective memory cell to external test circuits.

When an IC includes more than one embedded RAM it is possible to use a single BIST circuit to test each RAM in turn, provided however that all RAMs are similar and are to be tested in the same manner. But this approach requires routing large buses within the IC for connecting a central BIST circuit to each embedded RAM, and those buses can require substantial space in the IC. It not possible to use a single BIST circuit for testing multiple embedded RAMs when the embedded RAMs have differing address ranges or are to be tested in different ways.

To the extent possible, an IC designer usually prefers to design the layout of an IC by defining interconnections between a set of "standard cells", each standard cell specifying the layout within an IC of a component having a specific function. For example a standard cell might define the layout of an embedded memory, an I/O port, or any of many types of logic circuits. The designer's job is simplified when it is not necessary for him to design any cells in detail or to substantially modify the design of any standard cell when incorporating it into an IC.

Since each RAM embedded in an IC may be of differing size and have differing test requirements, an IC designer will typically provide a separate customized BIST circuit for each embedded RAM. A number of other factors also influence the nature of a BIST design. For example the available space within an IC and the number of available I/O terminals can influence how we apportion test functions between a BIST circuit and external test circuits.

Since IC designers must custom design a test system for each IC to suit the nature of its embedded RAMs, they find BIST systems difficult to implement. What is needed is a system for testing RAMs embedded in an IC that allows a designer to flexibly apportion test functions between internal BIST circuits and external test circuits and which can test embedded RAMs of varying numbers and sizes in any of several ways, but which the designer can easily implement using standard cells requiring minimal modification.

SUMMARY OF THE INVENTION

A test system in accordance with the invention includes a built-in self-test (BIST) circuit incorporated into an integrated circuit (IC) for testing one or more random access memories (RAMs) of varying size embedded in the IC. During normal circuit operation logic circuits implemented within the IC read and write access the RAMs. During a RAM test, the BIST system disconnects the logic circuits from the RAMs and connects internal test circuits to the RAMs I/O ports to enable them to test the RAMs.

The BIST circuit is capable of operating in any of several modes when testing each embedded RAM, with its mode of operation being selected by a controller that may be conveniently implemented internal or external to the IC. Selectable modes include:

a RAM "pass/fail" mode in which the BIST circuit tests each address of each RAM and generates an output FAILX signal indicating wherein any address of any RAM is defective;

a "bit map" mode in which the BIST circuit tests each address of each RAM and produces output data indicating the pass/fail status of each bit at that RAM address, thereby providing a map of defective RAM storage bits;

a "word map" mode in which the BIST circuit tests each RAM address and produces an output signal indicating whether that RAM address is defective, thereby providing a map of defective RAM addresses;

a "scan capture" mode in which the BIST circuit captures data appearing on each RAM's bus in a scan register in response to a CAPTURE signal from the external control and serially shifts it out to the controller in response to a SHIFT signal from the controller; and a "scan force" mode in which the BIST circuit receives and stores data from the controller in the scan register and forces it onto the bus of an embedded RAM in response to a FORCE signal from the controller.

In accordance with another aspect of the invention, the BIST circuit includes a set of "core wrappers", each incorporated into the IC near a corresponding one of the embedded RAMs. Each core wrapper includes a test circuit that it connects to the bus of its corresponding RAM during a test. When connected to the bus of its corresponding RAM, each test circuit writes data into each RAM address within the RAM's range of addresses, reads data out of each RAM address, and compares the data it reads out of each RAM address to the data it wrote into that RAM address to determine whether the RAM address is defective.

Each test circuit pulses an output error signal (CERR) whenever it determines a RAM address is defective, continuously asserts another output error signal (FAIL) after determining any RAM address is defective, and asserts a DONE signal when it has completed testing all RAM addresses. A glue logic circuit included in the IC logically ANDs the DONE output signals of the test circuits of all core wrappers to produce a single output DONEX signal, logically ORs the FAIL output signals of the test circuits of all core wrappers to produce a single output FAILX signal and multiplexes the CERR output signal of the test circuits of all core wrappers to select one of the them as a single output CERRX signal in response to selection data from an external controller. The controller monitors the DONE signal to determine when the test is complete during all modes of operation, monitors the FAILX signal during the pass/fail mode of operation to determine whether any IC is defective, and selects and monitors the glue logic output CERRX signal during the word map mode of operation to determine which memory addresses are defective.

In accordance with another aspect of the invention the controller sends each the test circuits within each core wrapper MIN, MAX data defining the range of addresses of the corresponding RAM. When it tests the RAM in any mode of operation, each test circuit restricts its test activities to that range of addresses.

In accordance with another aspect of the invention, the controller sends ROW/COL data to the test circuit of each core wrapper controlling whether the test circuit accesses RAM addresses on a row-by-row or column-by-column basis in any mode of operation.

In accordance with another aspect of the invention, each core wrapper includes a scan register for storing data appearing on the bus of the corresponding RAM in response to an input CAPTURE signal and for shifting that data out to a test circuit external to the IC in response to an input SHIFT signal when operating in the scan capture mode.

In accordance with another aspect of the invention, the test circuit within each core wrapper generates RESULTS data after testing each address of the corresponding RAM, when operating in the bit map mode. The results data indicates whether each bit of data written into that RAM address matches a corresponding bit of data read back out of that RAM address. The RESULTS data provides an additional input to the scan register so that may be stored in the scan register in response to the CAPTURE signal and shifted out to the controller in response to the SHIFT signal.

The controller provides DIAG input data to the test circuit within each core wrapper controlling whether it is to operate in the bit map mode. When operating in the other modes a tester tests each successive RAM address without waiting for the external control to capture and acquire RESULTS data. In the bit map mode, each tester waits for a READY signal from a controller after testing each RAM address before testing a next RAM address. The wait allows the controller time to capture and acquire the RESULTS data stored in the scan register.

In accordance with a further aspect of the invention, the function of the controller may be flexibly partitioned between a controller implemented internal to the IC, a controller implemented outside the IC, and a conventional general purpose integrated circuit tester without modifying the nature of the core wrappers or the glue logic circuit.

It is accordingly an object of the invention to provide a system for testing one or more RAMs of varying size embedded in an IC.

It is another object of the invention to provide a test system allowing an IC designer to flexibly select a manner in which each RAM is tested and to flexibly apportion test functions between test circuits internal and external to the IC.

It is a further object of the invention to provide an embedded memory test system that may be easily incorporated into an IC using standard cells requiring minimal customization, regardless of the size and number of embedded RAMs and regardless of the nature of the test or tests to be performed on each embedded RAM.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(s)

FIGS. 1 and 2 illustrate in block diagram form prior systems for testing an integrated circuit including an embedded circuit;

FIGS. 3A–3C and 4 illustrate in block diagram form a system in accordance with the invention for testing an integrated circuit including an embedded circuit;

DETAILED DESCRIPTION OF THE PREFERRED EMBODIMENT(s)

Figure 3C:
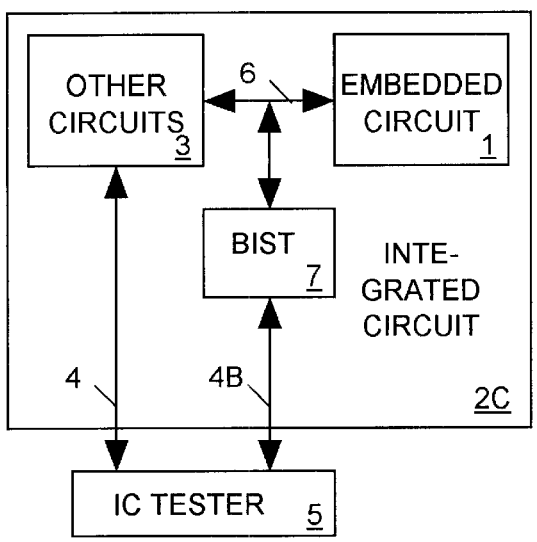

FIGS. 3A–3C and 4 illustrate alternative versions of a system in accordance with the present invention for testing a circuit 1 such as one or more random access memories embedded in an integrated circuit (IC) 2A–2D along with other circuits 3. Embedded circuit 1 communicates with other circuits 3 via input/output (I/O) terminals 4 that may be accessed by an external IC tester 5. However since the bus 6 linking embedded circuit 1 to other circuits 3 is not linked to IC I/O terminals, IC tester 5 cannot directly test embedded circuit 1. However as illustrated in FIGS. 3A and 3B, a built-in, self-test (BIST) circuit 7 is provided within integrated circuit 2A or 2B to access bus 6 and test embedded circuit 1. BIST circuit 7 communicates with a BIST controller circuit 8 which, as illustrated in FIG. 3A, may be implemented by a separate IC mounted on the same circuit board (load board 9) on which IC 2A is mounted when being tested by IC tester 5. BIST controller circuit 8 may alternatively be located within the IC 2B as illustrated in FIG. 3B. BIST circuit 7 is suitably located near embedded circuit 1 to minimize the IC space needed to route bus 6 to BIST circuit 7. BIST circuit 7 receives commands from and reports test results to BIST controller 8 through a relatively small bus 4B. BIST controller 8 communicates with IC tester 5 via a small bus 4C. BIST circuit 7 and BIST controller 8 not only test embedded circuit 1, they also eliminate the need to route a large bus 6 between IC tester 5 and embedded circuit 1.

Figure 4:
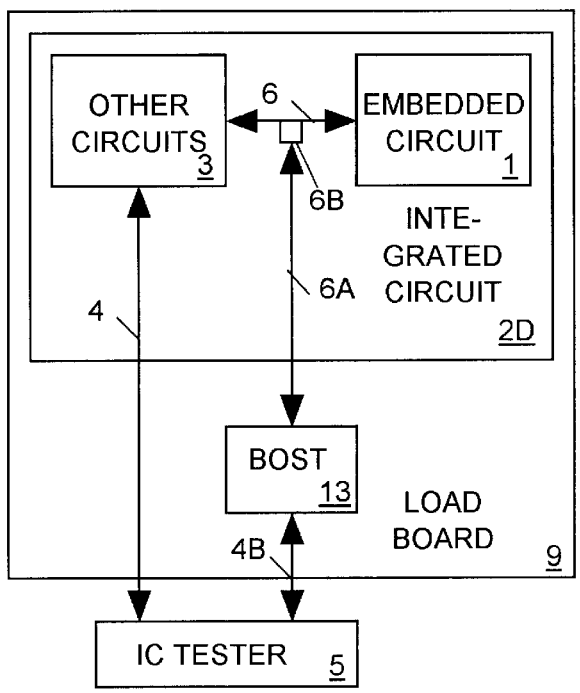

Alternatively, as illustrated in FIG. 3C, tester 5 may directly access a BIST circuit 7 within an IC 2C via bus 4B and carry out the function of BIST controller 8. As shown in FIG. 4, when it convenient to route bus 6 to I/O terminals of an IC 2D, the functions of a BIST circuit and a BIST controller can be carried out by a "built-off self-test" (BOST) circuit 13 mounted on a load board 9 and communicating with IC tester 5 through bus 4B. BOST controller 13 as well as BIST controller 8 of FIGS. 3A and 3B can be implemented as a field programmable gate array.

Thus the task of testing embedded circuit 1 can be conveniently partitioned between an IC tester 5, a BIST circuit 7, a BIST controller 8 and a BOST circuit 13. This flexibility in placing test circuit functionality is helpful, for example, when an integrated circuit chip is being developed. In many cases, a designer may want to experimentally determine how to best configure a BIST system to test an embedded circuit by trying out several different test designs. However it is too time consuming and expensive to produce a series of development IC's having differently configured BIST systems. The flexible system of the present invention allows the designer to initially produce a development chip that does not include the BIST circuit and/or its controller. The designer can then test the embedded circuit in the development IC using various external BIST controller or BOST configurations to see which is most suitable. Thereafter the best BIST controller or BOST configuration can be incorporated into a production version of the IC.

For example, IC 2A of FIG. 3A may be a development chip including the embedded circuit 1 to be tested and the internal BIST circuit 7, but which does not include a BIST controller 8. An external BIST controller 8 may then be coupled to BIST circuit 7, for example, through contact points 4D (e.g. probe contact pads) on IC 2A or via dedicated IC terminals. The external BIST controller 8 can then be developed and hardware and/or software modified to control BIST 7 so that it appropriately tests embedded circuit 1. Later, as illustrated in FIG. 3B, elements of the external BIST controller circuit 8 of FIG. 3A as developed and modified can be directly incorporated into the production version 2B of the IC as an internal BIST controller.

Also, referring to FIG. 4, a development chip 2D including an embedded circuit 1 can be provided without either a BIST circuit or a BIST controller. In such case an external BOST circuit 13 accessing bus 6, for example through probes 6A contacting pads 6B connected to bus 6 or dedicated IC terminals, can be developed and modified to appropriately test embedded circuit 1. Thereafter as illustrated in FIG. 3C, a BIST circuit 7, mimicking relevant elements of the developed BOST circuit 13 can be placed on a production version 2C of the IC.

Alternatively, after configuring the BOST circuit 13 of FIG. 4 to test the development IC 2D of FIG. 4, the BOST circuit design can be partitioned into a BIST circuit 7 and a BIST controller 8, with the BIST circuit 7 only being included in a production version 2A of the IC as illustrated in FIG. 3A, or with both BIST 7 and BIST controller 8 being incorporated into a production version 2B of IC as illustrated in FIG. 3B.

Embedded Memory Test System

Figure 5:
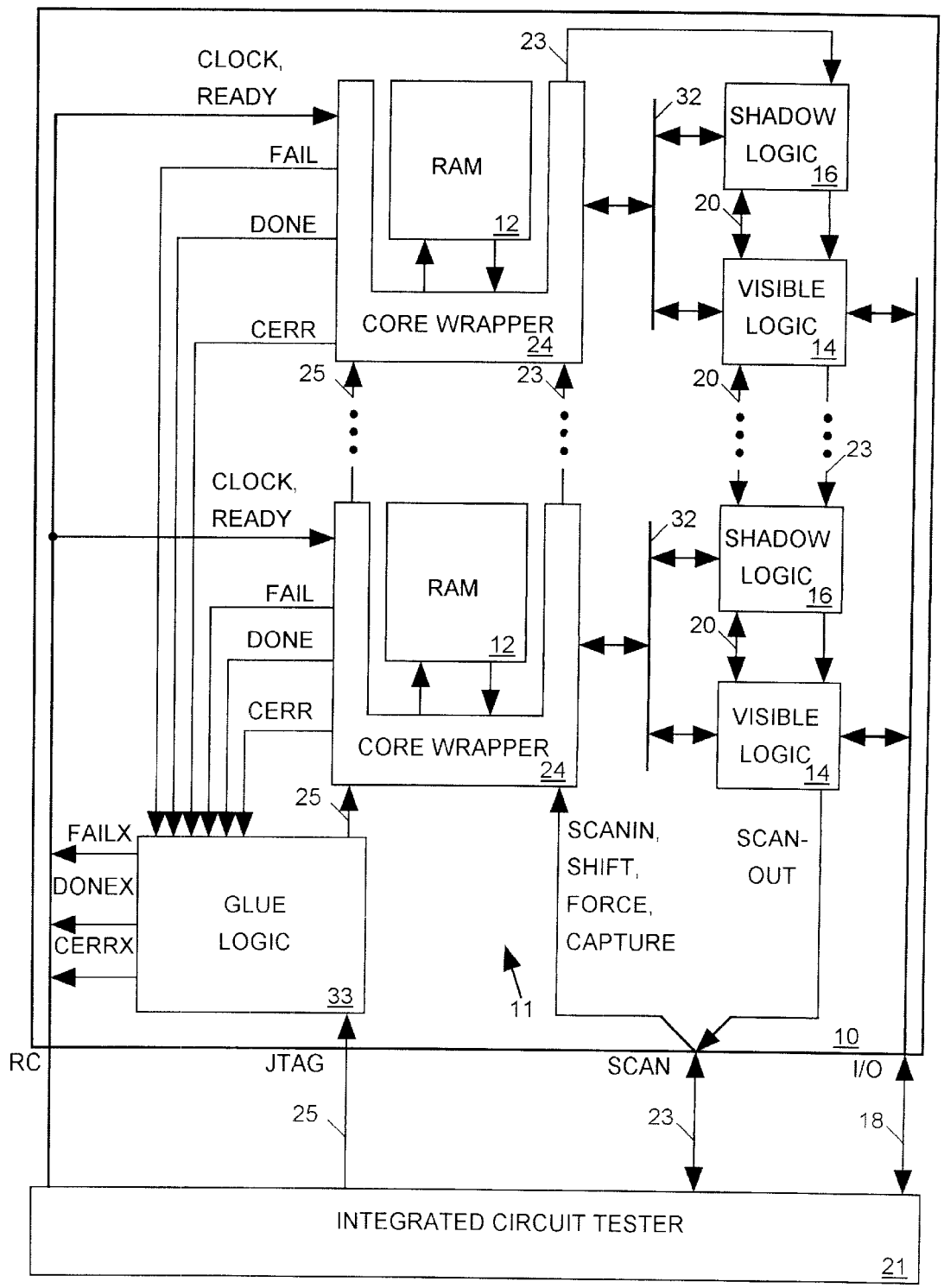
FIG. 5 illustrates in block diagram form a system in accordance with the invention for testing an integrated circuit including several embedded random access memories.

FIG. 5 is a block diagram of a test system 17 illustrating a version of the test system of the present invention as applied to an integrated circuit (IC) 10 including several embedded random access memories (RAMs) 12. In addition to one or more embedded random access memories (RAMs) 12, IC 10 includes logic circuits 14, 16 for read or write accessing RAMs 12, for communicating with external circuits though IC input/output (I/O) terminals 18, and for communicating with one another through internal lines or buses 20. A conventional external integrated tester 21 is provided to perform a logic test on logic circuits 14, 16 by applying input signal patterns to I/O terminals 18 and monitoring output signals patterns logic circuits 14, 16 produce at I/O terminals 18 in response to the input signal patterns.

RAM Testing

Test system 17 includes a built-in self-test (BIST) circuit 11 incorporated into IC 10 for carrying out or facilitating any of several different types of tests on IC 10 including directly testing each RAM 12, and assisting in tests of logic circuits 14, 16. Since the I/O port of RAMs 12 are not directly accessible to tester 21, tester 21 cannot directly test their operation to determine whether each address of each RAM 12 is correctly storing and reading out data. BIST circuit 11 is therefore provided to test RAMs 12 by disconnecting logic circuits 14, 16 from RAMs 12 and directly read and write accessing them via their I/O ports.

Shadow Logic Testing

BIST circuit 11 also gives IC tester 21 a view of data appearing on the buses 32 that logic circuits 14, 16 use to read and write access RAMs 12. Logic circuits 14 are "I/O visible" to tester 21 in the sense that they include a sufficient number of nodes directly linked to I/O terminals 18 that tester 21 can adequately monitor the behavior of logic circuits 14 during a test. On the other hand, "shadow" logic circuits 16 read and write access RAMS 12 and communicate with logic circuits 14, but have few (if any) nodes of interest directly connected to I/O terminals 18. Thus during a logic test, tester 21 is not able to directly monitor the behavior of nodes of interest within shadow logic circuits 16 via I/O terminals 18. Shadow logic circuits 16 derive their name from the notion that they are in the "shadow" of visible logic circuits 14 and RAMs 12 from the point of view of tester 21. When tester 21 cannot directly stimulate or monitor the behavior of various nodes of interest within IC 10, it can be difficult to determine the source of IC test failures based solely on data the tester acquires at I/O terminals 18. As discussed below, test system 17 of the present invention enables tester 21 to directly view nodes of interest not directly connected to I/O terminals 18 of IC 10. In particular, BIST circuit 11 allows tester 21 to monitor data traveling between logic circuits 14, 16 and RAMs 12 on buses 32 during memory accesses. BIST circuit 11 can also simulate the operation of RAM 12 by forcing known data onto buses 32.

BIST Circuit Portability

An IC designer typically designs the layout of an IC by defining interconnections between a set of "standard cells", each standard cell specifying the layout within an IC of a circuit component having a particular function. For example a standard cell might define the layout of an embedded RAM, an I/O port, or any of many types of logic circuits. The designer's job is simplified when it is not necessary for him to modify a standard cell when incorporating it into an IC design. However since embedded RAMs vary in size and testing requirements from IC-to-IC, prior art BIST circuits for testing embedded RAMs had to be customized to accommodate the particular number of RAMs embedded in the IC, for the particular size of each embedded RAM and for each kind of test to be performed. One of the objects of the invention is to provide a BIST circuit 11 that may be implemented in the form of standard cells for incorporation into almost any integrated circuit having one or more embedded RAMs with little modification regardless of the number and sizes of RAMs embedded in the IC, and regardless of the nature of the test to be performed on each RAM.

BIST Control Partitioning

BIST circuit 11 requires a controller for configuring it to carry out the desired tests on RAMs 12 and for receiving test results. BIST circuit 11 requires relatively few connections to its controller and allows flexibility in the partitioning of BIST control functions between internal and external control circuits. For example controller functions may be implemented by IC tester 21 as illustrated in FIG. 5, by a BIST controller embedded in IC 10 itself, by a BIST controller external to the IC, by a conventional, general purpose integrated circuit tester (automated test equipment), or by a combination of internal and external BIST controller and IC tester.

BIST circuit 11 has several modes of operation that allow it to test RAMs 12 and report test results in various ways, and to assist IC tester 21 in performing logic tests on logic circuits 14, 16. Each operating mode is discussed below.

User Mode

BIST circuit 11 includes a separate "core wrapper" 24 positioned near each RAM 12. During normal IC 10 operation, when IC 10 is not being tested, BIST circuit 11 operates in a "user" mode in which each core wrapper 24 connects its corresponding RAM 12 through a bus 32 (including data, address and read/write control lines) to the logic circuits 14 and 16 that read and write access that RAM. BIST circuit 11 also operates in the user mode when IC tester 21 is performing a conventional logic test on logic circuits 14, 16 thereby providing each logic circuit 14, 16 with access to the appropriate during such test.

Scan Capture Mode

Each logic circuit 14, 16 may include an internal parallel-in, serial-out shift register (a "scan register"), and scan registers within all logic circuits are linked to tester 21 through a conventional scan bus 23. Each node of interest within any logic circuit 14, 16 may provide a separate input to a scan register. At any time during a test, tester 21 may transmit a CAPTURE signal to the scan registers within logic circuits 14 and 16 via a line of a scan bus 23 telling them to load their input data. Tester 21 may thereafter serially shift that data outward from the scan registers via a SCANOUT line of scan bus 23. This gives tester 21 the ability to acquire a "snapshot" view of the states of a large number of internal circuit nodes not otherwise accessible via I/O terminals 18.

In accordance with the invention, each core wrapper 24 also includes a scan register 46 accessible through scan bus 23. In a "scan capture" mode of operation, the scan register within each core wrapper 24 responds to the CAPTURE signal on scan bus 23 by storing the data, address and control information appearing on the bus 32 providing logic circuits 14, 16 with access to RAM 12. When tester 21 acquires scan data from the scan registers within logic circuits 14 and 16 via scan bus 23, it also acquires the RAM bus data stored in the scan registers within core wrappers 14. Thus in the scan capture mode of operation, core wrappers 24 provide tester 10 with a snapshot view of states of logic circuit 14, 16 input/output signals appearing on RAM buses 32.

Scan Force Mode

The scan register within each core wrapper 24 includes a section connected to lines of the RAM bus 32 that convey the data output of RAM 12 to logic circuits 14, 16. Before carrying out an IC logic test at I/O terminals 18, tester 21 can shift data into that section of the scan register within each core wrapper 24 via scan bus 23. Thereafter, when testing the logic of logic circuits 14 and 16, IC tester 21 can assert a FORCE signal line of SCAN bus 23 telling each core wrapper 24 to force the data stored in that section of its internal scan register onto the data output lines of RAM bus 32 in lieu of any data currently being read out of the RAM 12. Thus any logic circuit 14 and 16 attempting to read access any RAM 12 address will receive the data stored in a scan register instead of the data stored at that RAM address. This force testing capability allows tester 21 to bypass RAMs 12 and to directly provide input data to each shadow logic circuit 16 via data lines of RAM bus 32 during a logic test.

RAM Pass/Fail Mode

A RAM is defective when any one of its addressable cells is defective, so IC test engineers would like to be able to test each cell to make sure that it is correctly storing and reading out data. But since RAMs 12 are not directly accessible to tester 21 via I/O terminals 18, it can be difficult to design a test that tester 21 can carry out at I/O terminals 18 that will ensure that every RAM 12 address is properly tested.

It is helpful to be able to directly test embedded RAMs 12 independent of the operation of logic circuits 14, 16. Some prior art embedded memory testing systems allow an external IC tester to directly test RAMs 12 by multiplexing their address, data and control lines 32 onto I/O terminals 18. During normal IC operation or during a normal logic test, terminals 18 would be connected to logic circuits 14, but during memory tests terminals 18 would be connected to RAM 12 input/output lines 32. However this approach requires us to route a large bus 32 from each RAM 12 to I/O terminals 18, and routing large buses often requires too much scarce space in an IC.

In the BIST circuit 11 of the present invention, each core wrapper 24 may be configured to operate in a pass/fail RAM testing mode in which it disconnects its RAM 12 from lines 32 and connects it instead to test circuits within the core wrapper itself. The test circuit of each core wrapper 24 then directly read and write accesses each address of RAM 12, comparing data written into the address to the data read back out to determine whether they match. When a core wrapper 24 detects a RAM 12 failure it asserts an output error signal (FAIL) and continues to assert the FAIL signal for the duration of the RAM test. When the test is complete, each core wrapper 24 asserts an output DONE signal. Thus the state FAIL signal output of each core wrapper 24 at the end of the test indicates whether its corresponding RAM passed or failed the RAM test.

The DONE and FAIL signal outputs of each core wrapper 24 could be provided directly to tester 21 so that tester 21 could determine when each core wrapper 24 has finished the test and can determine which RAMs 12, if any, failed. However when tester. 21 only needs to know if any RAM failed the test, it is not necessary to provide it with a separate FAIL signal output from each core wrapper. As shown in FIG. 5 IC 10 includes a "glue logic" circuit 33 for logically combining (for example "ORing") the FAIL signal outputs of core wrappers 24 to produce a single output FAILX signal provided to IC tester 21 indicating when any RAM 12 failed its RAM test, and for combining (suitably "ANDing") the DONE output signals of core wrappers 24 to produce a single DONEX signal indicating that all RAM tests are complete.

Glue logic circuit 33 may alternatively multiplex the FAIL and DONE signal outputs of core wrappers 24 onto the FAILX and DONEX signals, with the selection being controlled by IC tester 21. This gives tester 21 the ability to successively inspect the FAIL output of each core wrapper 24 via the single DONEX connection to determine which RAMs 12 failed the test. Glue logic circuit 33 includes an internal control register ("a JTAG register") for holding data controlling glue logic circuit logic. Tester 21 write accesses that control register via a conventional JTAG bus 25 in order to configure the logic operations it carries out on the FAIL and DONE signals.

Each core wrapper 24 also includes an internal JTAG register accessed by tester 21 via JTAG bus 25 for storing data for controlling their operations. Tester 21 initiates a pass/fail RAM test by first setting and resetting a RESET bit in the JTAG registers within core wrappers 24 to reset their DONE and FAIL signal outputs and to initialize them to carry out RAM tests. Tester 21 also sets a MODE bit in the JTAG register within each core wrapper 24 to tell it to disconnect its local RAM 12 from its RAM bus 32 and to re-connect the RAM to an internal test circuit within the core wrapper. Tester 21 also writes a separate set of MIN and MAX data into the JTAG registers within each core wrapper 24 to tell each core wrapper 24 the address range of the RAM 12 it is to test. Tester 21 then sets a START bit in the JTAG register within each core wrapper to tell it to begin testing its corresponding RAM 12.

Each core wrapper 24 then tests its RAM 12, asserts its FAIL output signals if it detects a RAM error, and asserts its output DONE signal at the end of the test. Glue logic circuit 33 then supplies its FAILX signal and DONEX signal tester 21. When glue logic circuit 33 is configured to AND the DONE signals and OR the FAIL signals to produce the FAILX and DONEX signals, tester 21 checks the state of the FAILX signal output of glue logic circuit 33 when the DONEX signal is asserted to determine whether any RAM 12 failed the RAM test. When glue logic circuit 33 is configured to multiplex the DONE signals and multiplex the FAIL signals to produce the FAILX and DONEX signal, tester 21 checks the state of the FAILX signal output of glue logic circuit 33 when the DONEX signal is asserted to determine whether one particular RAM 12 has failed its RAM test. Tester 21 may then use the JTAG bus to reconfigure glue logic circuit 33 to select the DONE and FAIL output of another core wrapper 24 and repeat the process to determine whether a next RAM 12 is defective.

RAM Bit Map Mode

It is sometimes helpful to know the particular location within each RAM 12 of every defective bit. For example, RAMs 12 may include spare rows or columns of memory cells for replacing rows or columns of cells containing one or more defective memory cells. When an external RAM repair system learns the addresses of defective cells within each RAM 12, it can reconfigure the RAMs so to use a spare row or column in lieu of any row or column containing a defective memory cell, for example by using a laser to alter signal routing paths within the RAM. Such RAM repair technology is well-known. In order to make use of spare row and column replacement, it is necessary for the repair circuit to know the row and column address of memory cells of RAMs 12 that fail a test as well as the particular bit or bits of that memory cell that failed. In its "bit map" mode of operation, each core wrapper 24 loads test result data for each addressable memory cell into its internal scan register so that tester 21 can acquire that data via scan bus 23. The result data indicates whether each bit of the memory cell is defective. The result data IC tester acquires for all memory cells forms a bit map of the defective storage locations within each RAM 12 that may be provided to an external RAM repair system.

To initiate a bit map mode RAM test, tester 21 first writes the MODE bit and a DIAG bit into the JTAG register within glue logic circuit 33. The MODE bit tells each core wrapper 24 that it is to connect its test circuit to its RAM 12, and the DIAG bit tells each core wrapper 24 that it is to perform a bit map mode test rather than a pass/fail mode test. Tester 21 then sets the START bit in the JTAG register to tell each core wrapper 24 to begin to test the first address of its RAM 12 and to make its test results available at the input of its internal scan register. In this mode each core wrappers 24 then assert its output DONE signal after testing its first address, thereby causing glue logic circuit 33 to pulse its output DONEX signal. Tester 21 responds to the DONEX signal by pulsing the CAPTURE signal line of scan bus 23 to tell core wrappers 24 to load test results data into their scan registers and by repeatedly pulsing a SHIFT signal line of scan bus 23 to shift the test results out of the scan registers via a SCANOUT line of scan bus 23 so that tester 21 can acquire the results data. Tester 21 then pulses a READY signal input to core wrappers 24 telling them to test a next memory address. The process repeats for each memory address so that by the end of the test, tester 21 will have acquired test results for every memory address. Tester 21 may then, for example, forward the test results to an external repair system.

RAM Word Map Mode

When a core wrapper 24 operates in a "word map" mode, tester 21 is able to acquire a map of defective RAM addresses for any particular RAM 12 although, unlike the bit map mode, tester 21 does not learn which particular bits of each defective address are defective. The advantage to the word map mode is that it is not necessary for the system to stop after each test to provide IC tester 21 with the time it needs to acquire results data after each RAM address is tested.

During a RAM test, when a core wrapper 24 detects a defective memory cell, it pulses an output current error signal (CERR). When BIST 11 is to operate in a "word map" mode, tester 21 writes data to a JTAG register within glue logic circuit 33 telling it to provide the DONE signal and CERR output signal of a particular one of core wrappers 24 as DONEX and CERRX inputs to tester 21. Therefore when tester 21 initiates a RAM test, tester 21 sees the DONE and CERR outputs of only one core wrapper 24. During each cycle of the RAM test in which a particular RAM address is tested, the CERRX signal output of glue logic 33 indicates whether the RAM 12 address last tested by particular core wrapper 14 passed the test and the DONEX signal indicates when the CERRX signal is valid. The sequence of CERR signal bit states produced during a RAM test acts as a map of the failed addresses of the particular RAM 12 controlling the CERR output of glue logic 33. To provide such a bit map for each RAM 12, tester 21 repeats the RAM test for each RAM 12, sending selection data via the JTAG bus to reconfigure glue logic 33 before each test to select the DONE and CERR outputs of the core wrapper 24 of the RAM 12 to be next tested.

CORE Wrapper Architecture

Figure 6:
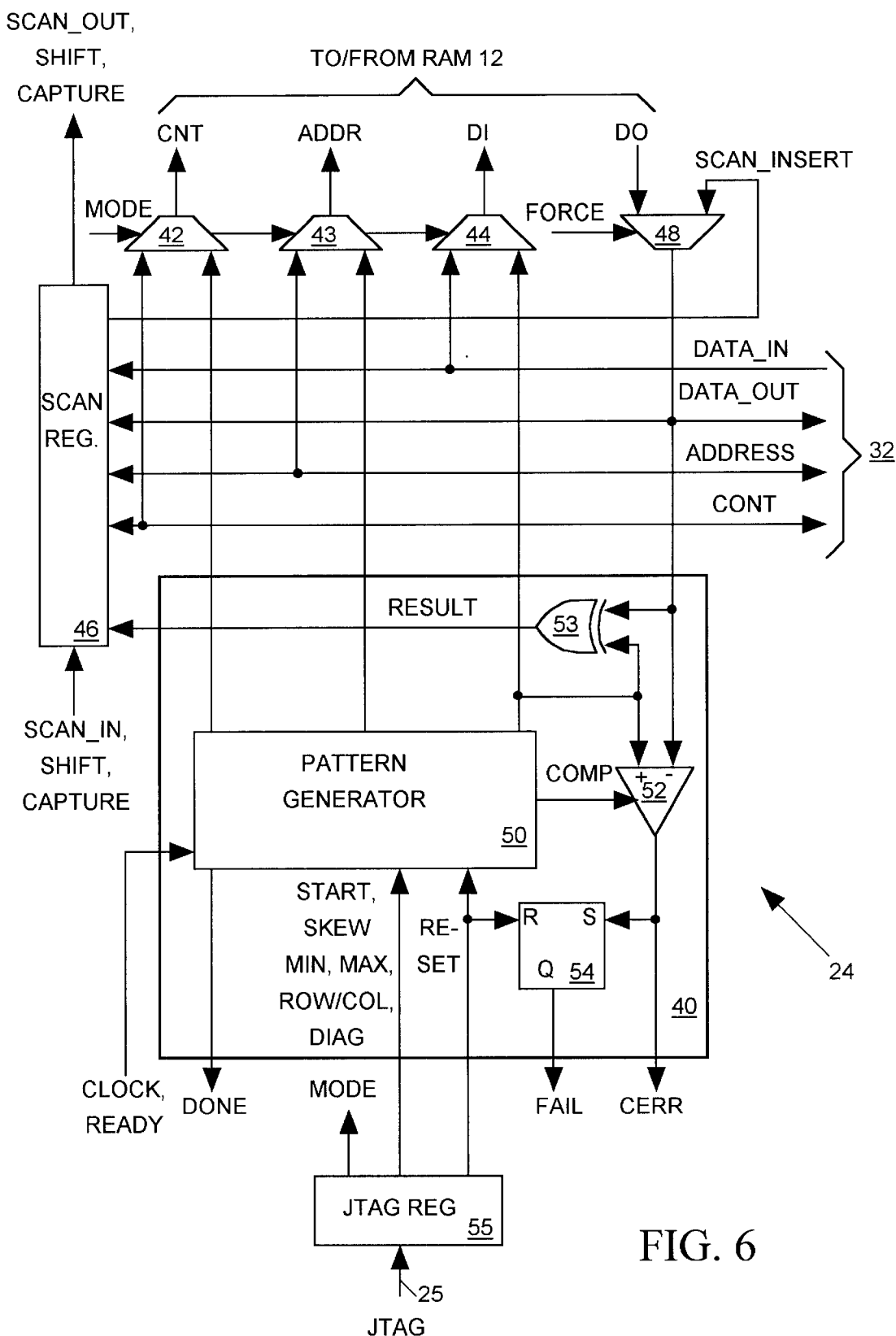
FIG. 6 illustrates a typical core wrapper of FIG. 5 in more detailed block diagram form.

FIG. 6 illustrates a typical core wrapper 24 of FIG. 5 in more detailed block diagram form. Core wrapper 24 is designed to carry out any of the above-described test modes on a RAM of any size without modification. Core wrapper 24 includes a RAM test circuit 40, clocked by a CLOCK signal from IC tester 21 of FIG. 5, for responding to an input START signal by read and write accessing each address of RAM 12 (FIG. 5) and for comparing data written into each address with data thereafter read out to determine whether they match. Test circuit 40 asserts a FAIL output signal whenever it detects a defective RAM address and thereafter continues to assert the FAIL signal until the end of the test. RAM test circuit 40 also briefly pulses a "current error" output signal (CERR) whenever it detects a defective RAM address and pulses an output DONE signal either after testing each RAM address (bit map or word map modes) or after it has tested all addresses (pass/fail mode).

Core wrapper 24 includes a scan register 46 for storing data, address and control signals appearing on bus 32 in response to the CAPTURE signal from tester 21 and shifts out its stored data onto the SHIFT_OUT line of scan bus 23 in response to successive pulses of the SHIFT signal from tester 21.

Core wrapper 24 also includes a set of multiplexers 42–44 under control of a MODE signal for alternatively connecting the control (CNT), address (ADDR), and data in (DI) input ports of RAM 12 (FIG. 5) selectively either to test circuit 40 or to control (CONT), address (ADDRESS) and data in (DATA_IN) lines of RAM bus 32 leading to logic circuits 14 and 16 of FIG. 5. A multiplexer 48 under control of a FORCE signal line of the scan bus normally connects the data out (DO) output port of RAM 12 to both test circuit 40 and to data out lines (DATA_OUT) of bus 32 leading to logic circuits 14 and 16 of FIG. 5. However when tester 21 of FIG. 5 asserts the FORCE signal, multiplexer 48 forces a word (SCAN_INSERT) stored in scan register 46 onto the DATA_OUT lines of bus 32 so that logic circuits 14, 16 of FIG. 5 see the SCAN_INSERT data stored in register 46 instead of the data stored in RAM 21 when they attempt to read access RAM 12. To load the SCAN_INSERT data into scan register 46, tester 21 serially shifts the SCAN_INSERT data onto the SCAN_IN line of scan bus 23 as it pulses the SHIFT signal.

Tester circuit 40 includes a pattern generator 50 clocked by the CLOCK signal for generating data, address and control data patterns supplied as inputs to RAM 12 via multiplexers 42–44 during a RAM test. Pattern generator 50 writes data into each address of RAM 12 and then signals RAM 12 to read it back out. During RAM 12 read cycles, pattern generator 50 sends a COMP signal to a data comparator 52 which compares the data pattern generator 50 wrote into a RAM address to the data the RAM is currently reading back out of that address. When the RAM input and output data fail to match, comparator 52 asserts the CERR signal. The CERR signal drives a set input of an RS flip-flop 54 reset by a RESET signal at the start of a test. Flip-flop 54 produces a FAIL signal at its Q output. When data comparator 52 first detects a faulty RAM address, the CERR signal sets flip-flop 54 to assert the FAIL signal. Flip-flop 54 then continues to assert the FAIL signal until tester 21 resets it.

An XOR gate 53 combines the RAM 21 data input produced by pattern generator 50 and the data read out of RAM 21 to produce a RESULT data word supplied as input to scan register 46. Each bit of the RESULT data word corresponds to a bit of RAM 12 output data and indicates whether that bit matches a corresponding bit of input data. In the bit map mode, tester 21 pulses the CAPTURE signal line of the SCAN bus to capture the RESULT data in scan register 46 and then repeatedly pulses a SHIFT signal line of the scan bus to signal scan register 46 to shift the captured data out onto the SCAN_IN line of the scan bus.

Core wrappers 24 of FIG. 5 may be implemented as "standard cells" easily incorporated without modification into the design of any IC 10 having one or more embedded RAMs 12, even though RAMs 12 of FIG. 5 may have differing address spaces. Since the pattern produced by the pattern generator 50 within each core wrapper 24 must match the characteristics of the RAM 12 being tested, MIN and MAX control data stored in the JTAG register 55 defines the range of RAM 12 addresses each core wrapper 24 is to test. With separate MIN and MAX data provided to each core wrapper 24, the core wrappers are able to concurrently test RAMs 12 of differing size. Tester 21 may write the MIN and MAX data into JTAG register 55 via JTAG bus 25 before the start of a test.

Pattern generator 50 can generate either of two types of output data patterns that sequence RAM addresses in two different ways. A RAM 21 is typically organized into an array of rows and columns of addressable memory cells and a cell's address includes the addresses of its row and column. Pattern generator 50 can be configured to write and read address each successive cell of a row before moving on to a next row ("fast row mode") or to write and read address each cell of a column before moving on to a next column ("fast column mode") The choice of fast row or column mode depends on whether RAM 12 can respond faster to a change in row or column address. Tester 21 of FIG. 5 writes a ROW/COL word into JTAG register 55 via JTAG bus 25 to tell it whether it is to operate in the fast row or fast column mode.

Tester 21 also sets and then resets a RESET bit stored in JTAG register 55 to reset flip-flop 54 and to place pattern generator 50 in an initial state, sets a MODE bit in register 55 to switch multiplexers 42–44, sets a DIAG bit in register 55 to indicate when pattern generator is to operate in the bit map or word map mode, and sets a START bit in register 55 to signal pattern generator 50 to begin a test. SKEW data tester 21 writes into JTAG register 55 tells pattern generator 50 how to adjust the relative timing of the CONT, ADDR and DI signals it produces in order to accommodate the signal timing of the RAM under test.

Controller Partitioning

As illustrated in FIG. 5 and discussed herein above, IC tester 21 may use the JTAG bus to configure core wrappers 24 and glue logic circuit 33 to carry out any of the above-described modes of operation and may use the ROW/COL and SCAN buses during the test to acquire data produced by the core wrappers and glue logic circuit 33. However as described below, much of the BIST control functions of tester 21 may be assumed by dedicated controllers either internal or external to IC 10 without any modifications to core wrappers 24 or glue logic circuit 33. The manner in which we choose to implement control functions depends on many factors. For example when there is available space within IC 10, when we are interested in minimizing the number of terminals IC 10 needs to convey information between tester 21 and BIST circuit 11, and when we want to limit the need for tester resources, we can include a BIST controller inside IC 10. Otherwise we can implement the controller in the form of a separate IC located outside IC 10. Or BIST control functions can be shared by internal and external controllers.

IC Tester/BIST Controller

Figure 7:
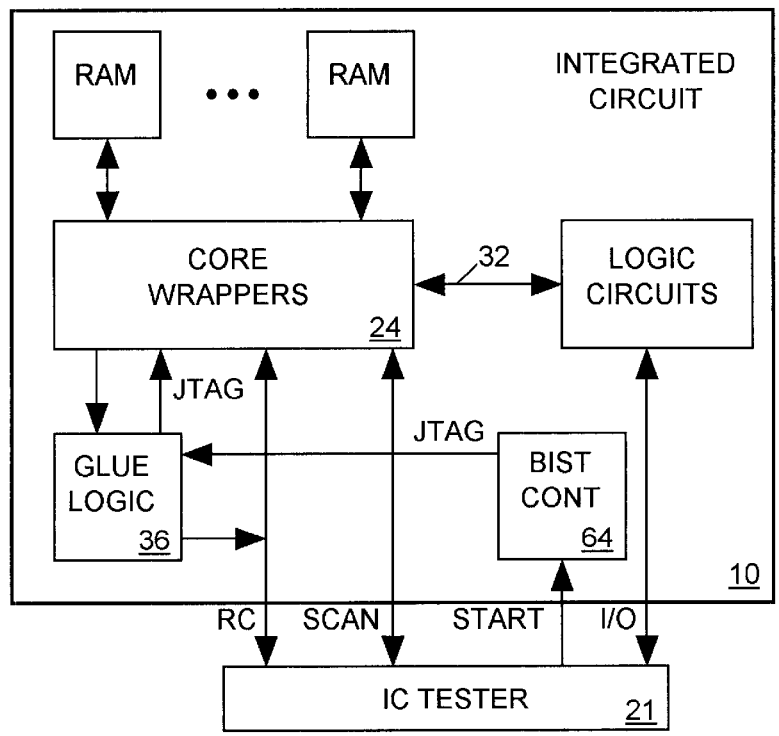
FIGS. 7–11 illustrate alternative embodiments of the test system of the present invention in block diagram form.

FIG. 7 illustrates an alternative embodiment of the test system of FIG. 5 in which an internal BIST controller 64 has been included in IC 10 for assuming various functions of IC tester 21 in configuring and controlling core wrappers 24 and glue logic 36. BIST controller 64 is suitably a conventional pattern generator for producing an appropriate sequence of patterns on the JTAG and RC (ROW/COL) buses when IC tester 21 commands it to start a test, for example, by a dedicated START signal. BIST controller 64 produces the same sequence of control data that tester 21 would otherwise have to provide on the RC and JTAG buses in order to configure glue logic 36 and core wrappers 24 to carry out various tests on RAMs 12 and to start their test operations. Since pattern generators capable of carrying out the function of BIST controller 64 are well-known, BIST controller 64 is not further detailed herein.

Installing a BIST controller 64 on IC 10 allows us to reduce use of IC tester 21 resources and to reduce the number of IC 10 terminals needed to interconnect IC tester 21 to IC 10. Table I lists the connections needed between IC tester 21 and IC 10 for each of the test modes when BIST controller 64 is installed on IC 10.

TABLE I

| TEST MODE | CONNECTIONS |
|---|---|
| All Modes | CLOCK, START |
| Pass/Fail | DONEX, FAILX |
| Scan Capture | SCAN bus |
| Scan Force | SCAN bus |

TABLE I-continued

| TEST MODE | CONNECTIONS |
|---|---|
| Bit Map | SCAN bus, READY |
| Word Map | CERRX |

A JTAG bus connection between IC 10 and tester 21 isn't required since BIST controller 64 produces the appropriate patterns on the JTAG bus. However when available, tester 21 could use the JTAG bus to send a START command to BIST controller 64 instead of directly sending a dedicated START signal to BIST controller 64. The SCAN bus connection from tester 21 is needed only when either scan capture, scan force or bit map mode testing is needed. The CERR signal of the RC bus is needed only when a Word map mode test is to be performed.

Those skilled in the art will appreciate that the test control pattern BIST controller 64 produces on the JTAG and RC buses in response to the START signal can be programmed into BIST controller 64 at the mask level. However this requires BIST controller 64 to be custom-designed for each IC in which it is installed because the nature of the test pattern it must produce depends on the size and number of embedded RAMs 12 and on nature of tests to be performed. However BIST controller 64 can be implemented as a conventional programmable pattern generator programmed by input data supplied, for example, via a JTAG or similar bus from an external host computer or other data source. In such case the BIST controller 64 can be implemented as a standard cell that may be incorporated into any IC employing one or more core wrappers 24 regardless of the number or size of embedded RAMs to be tested and regardless of which tests are to be performed. When glue logic circuit 33 is also programmable, the test system can be implemented entirely as standard cells that do not need to be modified to accommodate the size or test requirements of the RAMs embedded in the IC.

Tester and External BIST Controller

Figure 8:
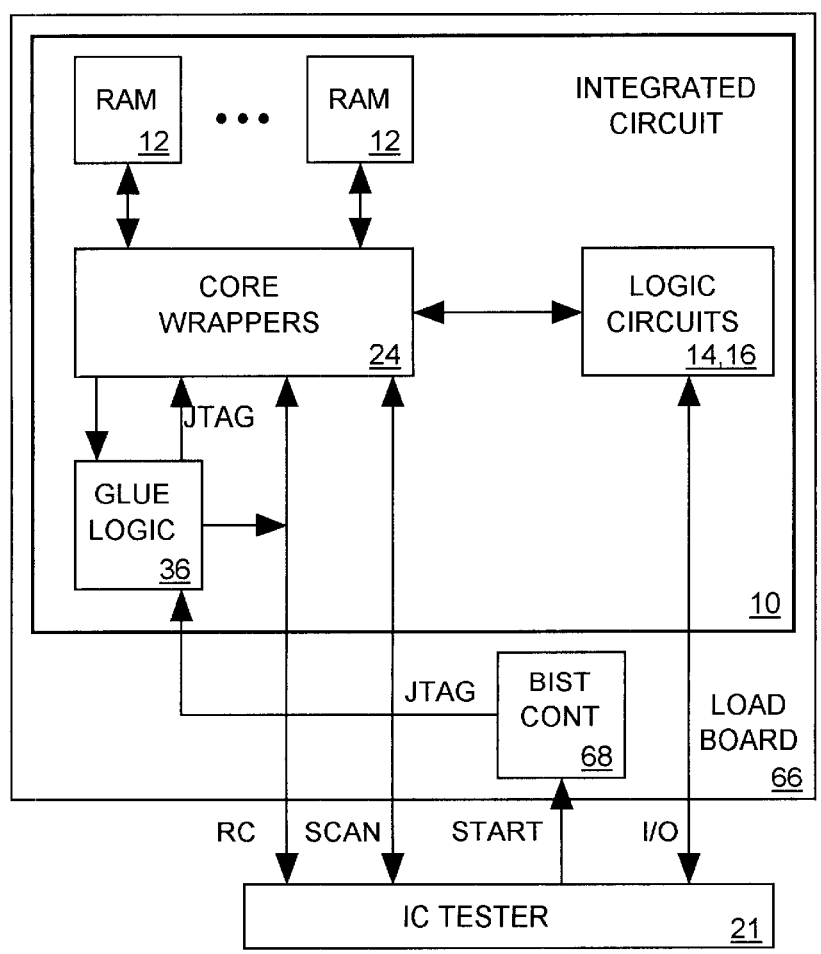

FIG. 8 illustrates an alternative version of the test system of FIG. 5 in which IC 10 is mounted on a "load board" 66, a conventional printed circuit board for holding IC 10 and for routing signal between tester 21 and IC 10 during tests. When it is not possible or otherwise desirable to install a BIST controller within IC, the function of internal BIST controller 64 of FIG. 7 can be implemented by an external BIST controller 68, a separate IC suitably mounted on load board 66. External BIST controller 68 may be similar in nature and operation to internal BIST controller 64 of FIG. 7. Although an external BIST controller 68 requires us to provide more IC 10 terminals than the internal BIST controller 64 of FIG. 7, it nonetheless allows us to minimize the required number of IC tester 21 channels.

External BIST Controller Only

Figure 9:
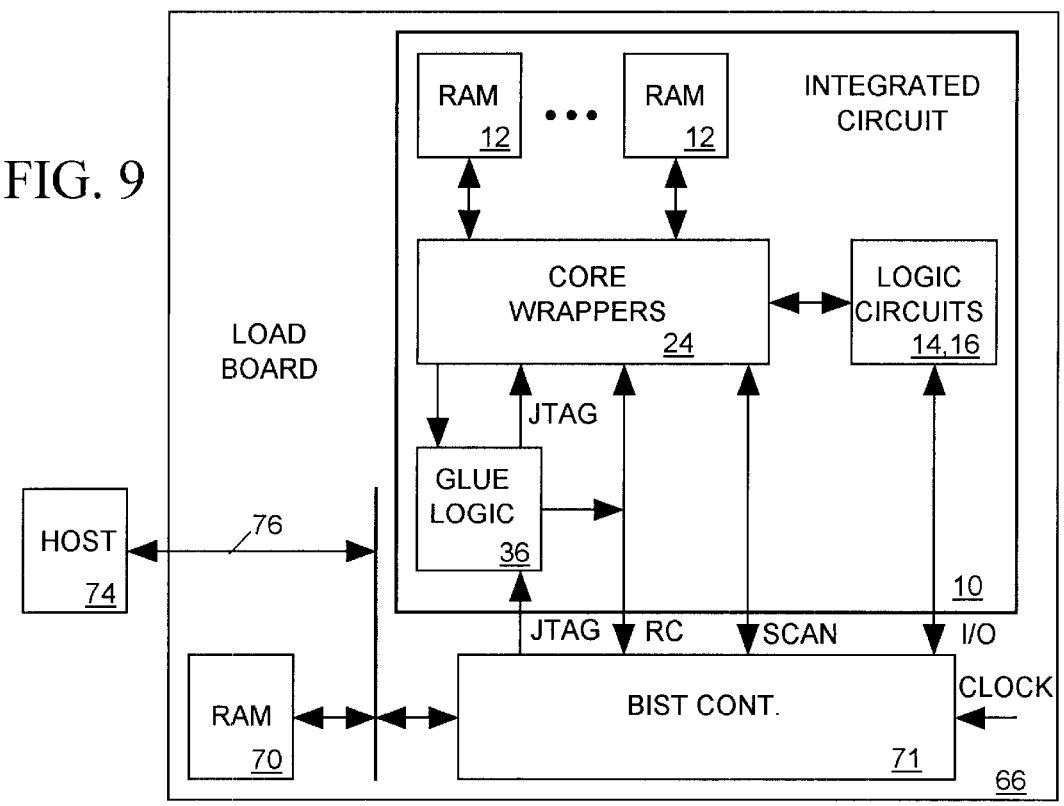

In some applications it may be desirable for all functions of tester 21 of FIG. 5 to be carried out by a dedicated external BIST controller. FIG. 9 illustrates an embodiment of the test system including a load board 66 holding IC 10, a RAM 70 and a programmable BOST controller 71 clocked by a CLOCK signal from a source that may be internal or external to load board 66. An external host computer 74 writes a test program into RAM 70 via conventional computer bus 76, and then sends a START command to BOST controller 71 via bus 76 telling it to execute that test program. The program stored in RAM 70 tells BOST controller 71 to carry out all test functions that might otherwise be carried out by tester 21 of FIG. 5 including supplying test pattern inputs to logic circuits 14, 16 via the I/O terminals of IC 10, supplying control signal patterns to core wrappers 24 and glue logic circuit 36 via the RC, SCAN and JTAG buses, and appropriately processing IC output data appearing on the I/O[,] and SCAN buses. RAM 70 of FIG. 9 may replaced with a read only memory (ROM) storing a test program appropriate for IC 10. In such case host computer 74 need only supply a START command to BOST controller 71 and acquire test results—it need not actively program the BOST controller 71.

BIST/BOST Controllers

Figure 10:
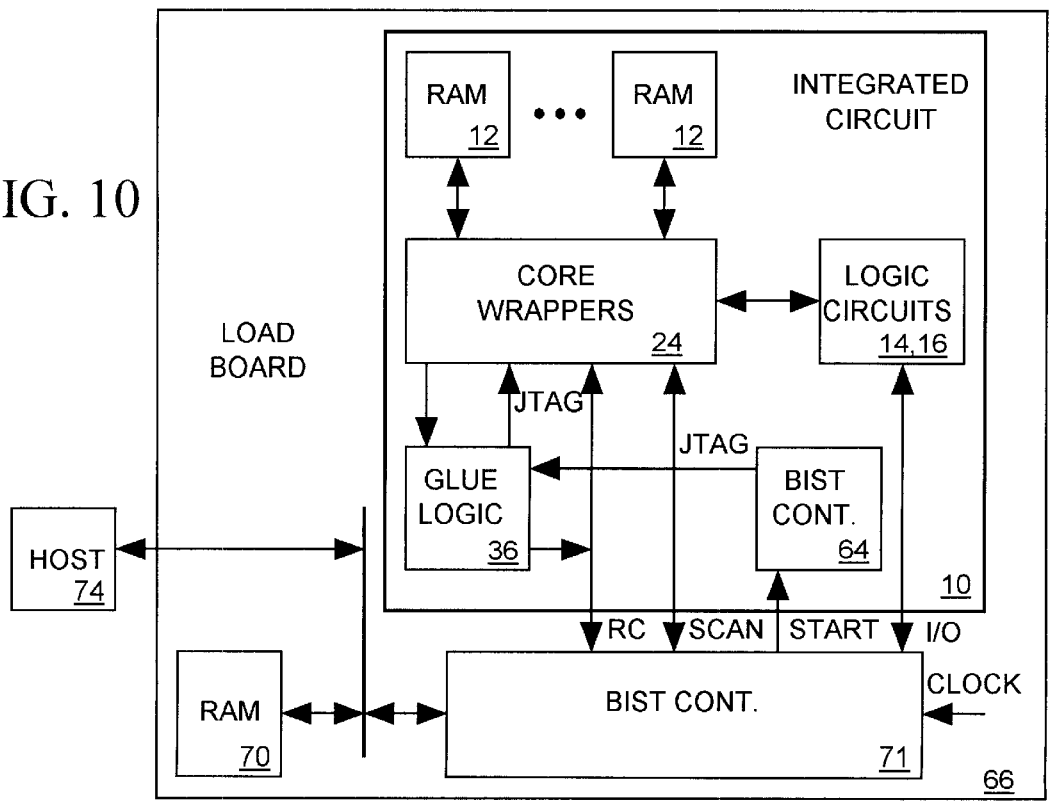

FIG. 10 illustrates an embodiment of the test system similar to that of FIG. 9 except the BIST control functions are shared by an internal BIST controller 64 and external BIST controller 71. This reduces the number of I/O terminals of IC 10.

BIST Controller Only

Figure 11:
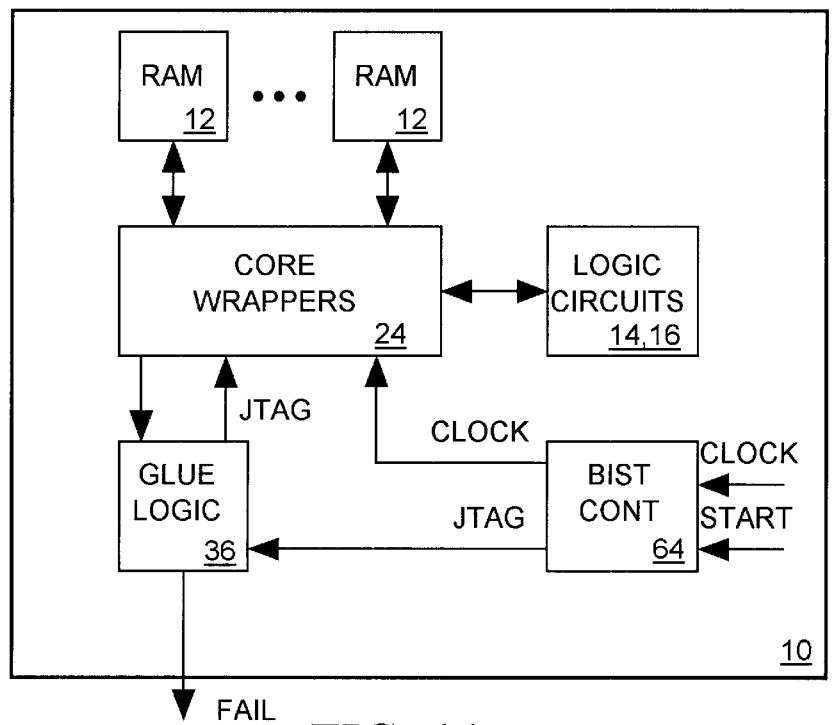

FIG. 11 illustrates an embodiment of the test system of the present invention in which a BIST controller 64 connected to the JTAG and RC buses independently carries out a pass/fail test on RAMs 12 in response to an input START signal from any source. The START signal may, for example, be generated by an internal IC circuit on system start up or by any circuit external to IC 10. The only IC output is the FAILX signal provided by glue logic circuit 36. The FAILX signal can, for example, be used to trigger an alarm. This system is useful for testing RAMs 12 when IC 10 is in its normal working environment and not accessible to external test equipment.

BOST Circuit

Figure 12:
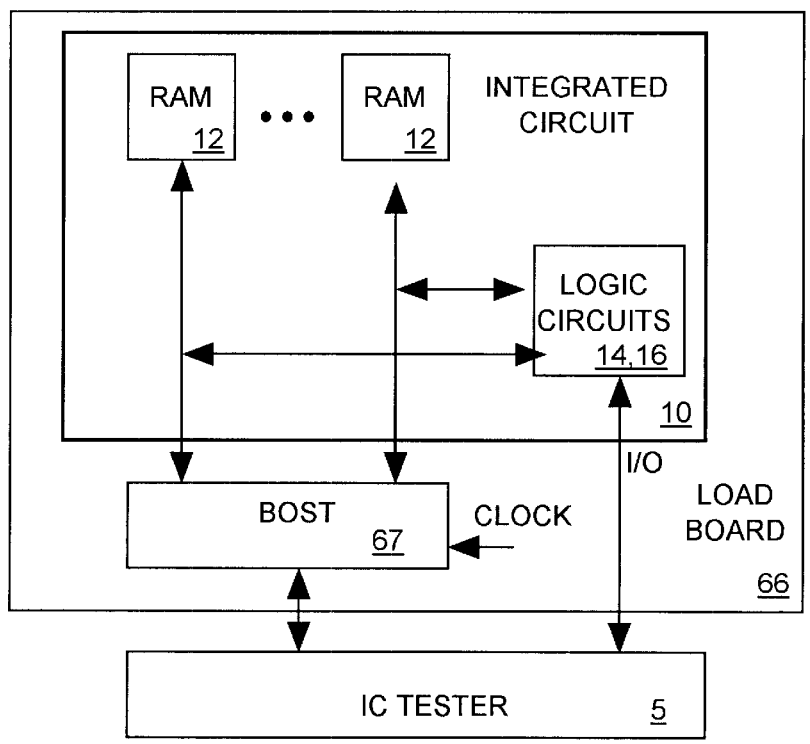
FIG. 12 illustrates the pattern generator of FIG. 6 in more detailed block diagram form.

When it is convenient to connect the buses logic circuits 14, 16 employ to access RAMs 12 to I/O terminals of IC 10, the functions of core wrappers 34, glue logic 36 and BIST controller 68 of FIG. 8 can be implemented by a built off-chip self test (BOST) p circuit 67 (FIG. 12), an integrated circuit mounted on load board 66. While use of BOST circuit 67 does not eliminate the need for bringing the buses accessing RAMs 12 to I/O terminals of IC 10, BOST circuit 67 reduces the number of channels tester 5 needs to test IC 10. BOST circuit 67 may be implemented, for example, by an appropriately programmed field programmable gate array (FPGA).

Core Wrapper Pattern Generator

Figure 13:
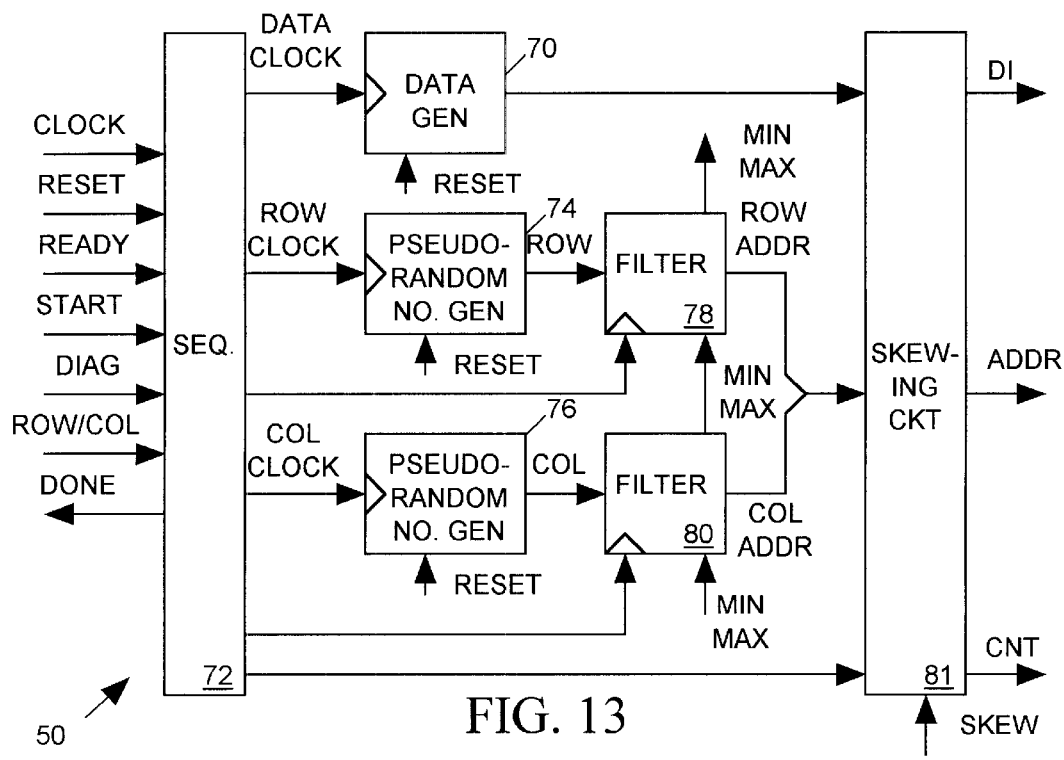
FIG. 13 illustrates the pattern generator of FIG. 6 in more detailed block diagram form.

FIG. 13 illustrates pattern generator 50 of FIG. 6 in more detailed block diagram form. Pattern generator 50 includes a data generator 70 clocked by a DATA CLOCK signal from a sequencer 72 for producing the data pattern to be placed on the data input lines (DI) of RAM 12 (see FIG. 6). A pair of pseudorandom number generators 74 and 76 respond to a row address clock signal or a column address clock signal from sequencer 72 by producing a sequence of row or column numbers (ROW or COL) spanning the widest ranges of RAM row and column addresses that the BIST system is capable of handling. A pseudorandom generator is similar to a counter in that it produces a sequence of numbers spanning a particular range. However whereas a counter generates the number in numerical order, a pseudorandom number generator generates them in pseudorandom order. A pseudorandom number generator can be implemented with fewer gates than a counter.

A pair of digital filters 78 and 80 filter the ROW and COL address outputs of number generators 74 and 76 to produce the address (ADDR) supplied to RAM 12 of FIG. 5. Normally filters 78 and 80 simply form their ADDR output by combining their ROW and COL address inputs. However the MIN, MAX data output of JTAG register 55 of FIG. 6 is supplied to generators 74 and 76 to tell them the range of row and column addresses ROW and COL that are within the address space of the RAM. If a ROW or a COLUMN address is not within the indicated range, filter 78 or 80 supplies as output the last received ROW or COL address input that was within the indicated range. For example let us assume a RAM 12 has an 8-bit ROW address spanning the range of 0–255 but that number generator 74 produces a 16-bit output ROW address 0–65535. Suppose number generator 74 produces output ROW address 112 on the nth cycle of the ROW address clock but produces address 1112 on the (n+1)th cycle. Then on the nth cycle filter 78 will forward its incoming ROW address 112 as the row address portion of the output ADDR word and will also save address 112 in an internal register. On the (n+1)th cycle of the row address clock, filter 78 will forward the row address 112 stored in its internal register rather than the current incoming row address 1112, because the incoming row address is outside the range of RAM being tested. Thus the cell at row address 112 is tested twice.

A skew circuit 81 adjustably delays each of the DI, ADDR and CNT outputs of data generator 60, filters 78 and 80, and sequencer 72 with delays controlled by the SKEW data input from JTAG register 55 of FIG. 6. The delays are set to accommodate the timing requirements of the R AM under test.

Address Filter

Figure 14:
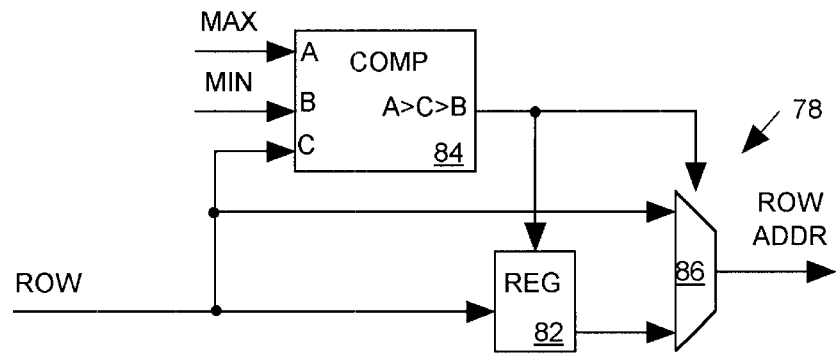
FIG. 14 illustrates the filter of FIG. 13 in more detailed block diagram form.

FIG. 14 illustrates the row filter 78 of FIG. 13 in more detailed block diagram form; column filter 80 is similar. Referring to FIG. 13, filter 78 includes a register 82 for storing an incoming ROW address, a comparator 84 for determining whether the incoming ROW address is within t he range indicated by the input MIN, MAX data and for loading the incoming row address into register 82 when it does. A multiplexer 86 controlled by comparator 84 selectively provides either the incoming ROW address or a ROW address stored in the register depending on the result of the comparison.

Glue Logic

Figure 15:
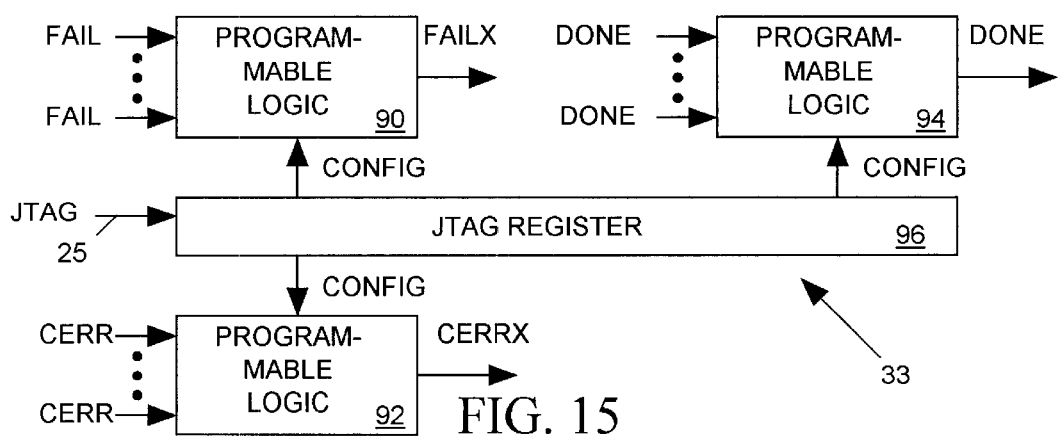
FIG. 15 illustrates a suitable implementation of the glue logic circuit of FIG. 5 in more detailed block diagram form.

FIG. 15 illustrates a suitable implementation of glue logic circuit 33 of FIG. 5 in more detailed block diagram form. Glue logic circuit 33 includes a set of programmable logic circuits 90, 92 and 94 for respectively producing the FAILX, CERRX and DONEX signals in response to the FAIL, CERR and DONE signals produced by core wrappers 24 of FIG. 5. A JTAG register 96 receives configuration data (CONFIG) from tester 21 via JTAG bus 25 and supplies it to programmable logic circuits 90, 92 and 94 to control the logic they perform on their input signals. Each logic circuit 90, 92 or 94 is suitably a programmable gate array or similar device capable of being programmed to produce its output signal, for example, by ANDing, ORing or selecting from among its input signals. In embodiments of the invention in which the logic functions of glue wrapper 33 are fixed, programmable logic circuits 90, 92 and 94 can be replaced by suitable non-programmable logic circuits. In such case JTAG register 96 is not needed.

Figure 16:
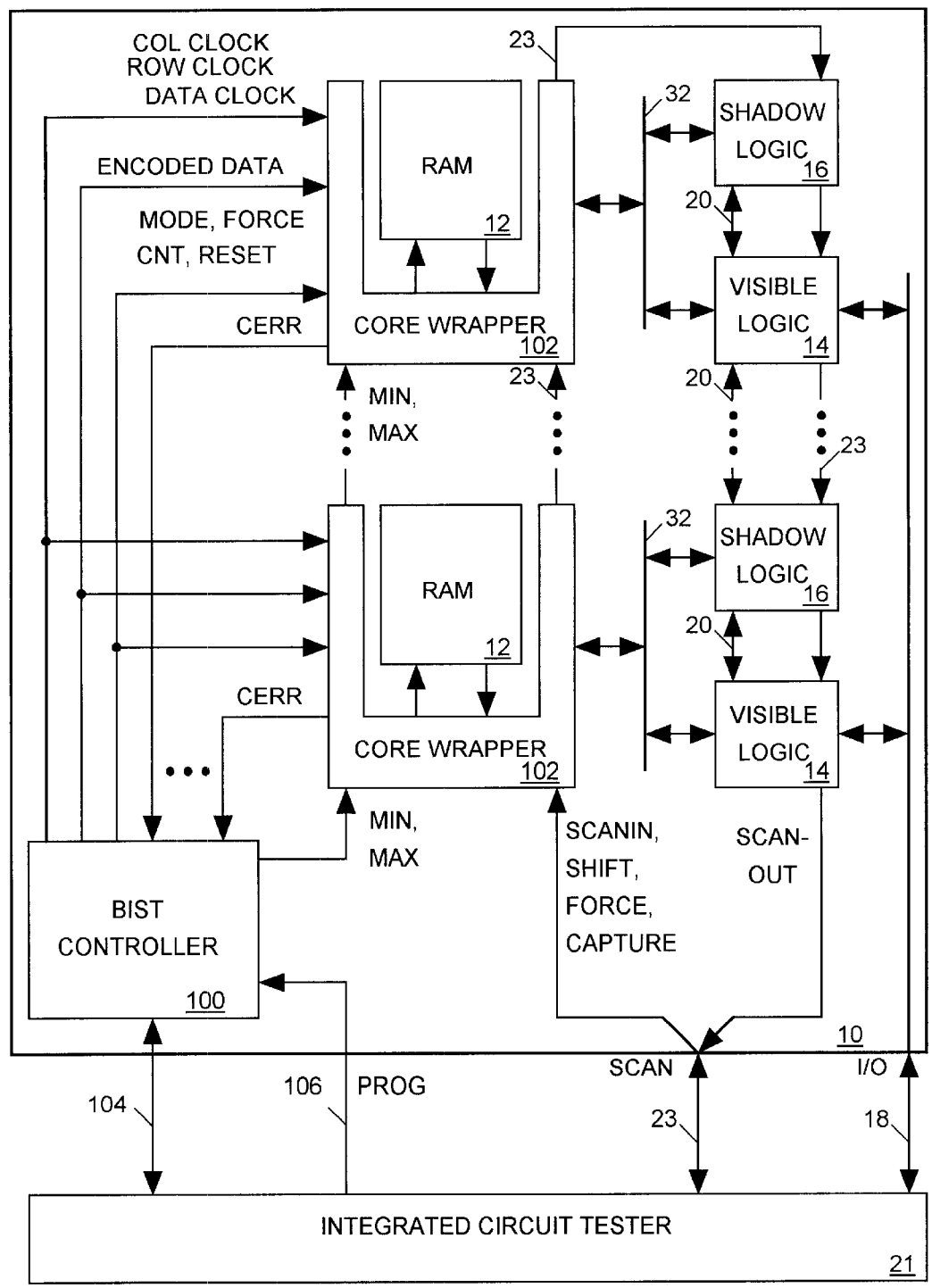
FIG. 16 illustrates in block diagram form an alternative embodiment of a system in accordance with the invention for testing an integrated circuit including several embedded random access memories.

FIG. 16 illustrates an alternative version of the invention that is somewhat similar to the embodiment of FIG. 5 and similar elements are designated by similar reference characters. However in the test system of FIG. 16, some of the functionality included within core wrappers 24 of FIG. 1, along with the function of glue logic 33, has been centralized into a BIST controller 100 that communicates with all core wrappers 102 of FIG. 16 via a set of control lines and with integrated circuit tester 21 via a bus 104. BIST controller 100 may be implemented within IC 10 as shown if FIG. 16 or may be implemented external to IC 10.

Figure 17:
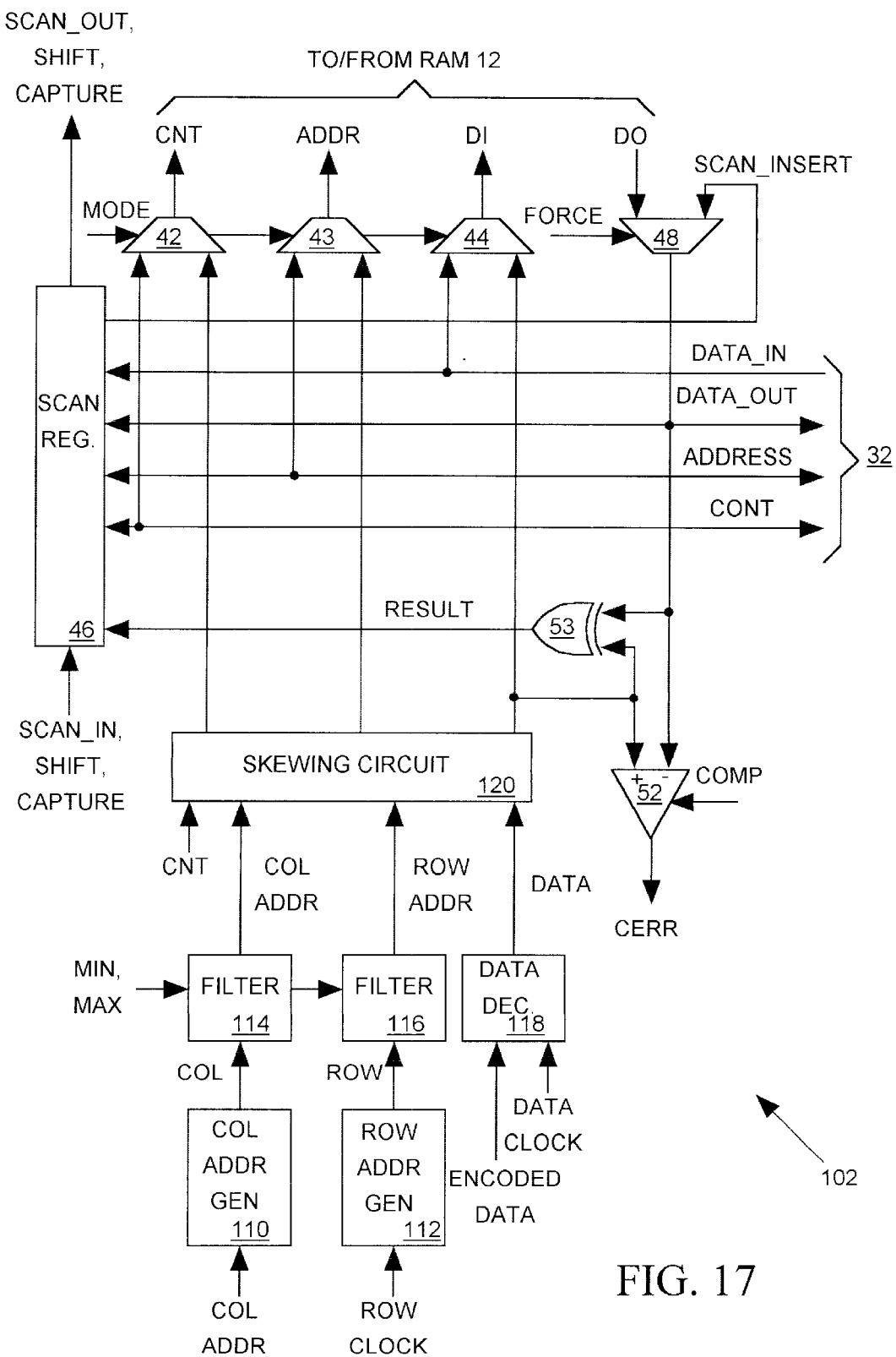
FIG. 17 illustrates a typical core wrapper of FIG. 16 in more detailed block diagram form.

FIG. 17 illustrates a typical core wrapper 102 of FIG. 16 in more detailed block diagram form. Core wrapper 102 has many elements in common with core wrapper 24 of FIG. 6, and similar elements are designated by similar reference characters, however the pattern generator 50, JTAG register 55 and flip-flop 54 of core wrapper 24 have been replaced in core wrapper 102 with a set of devices 110–120. Referring to FIGS. 16 and 17, a column address generator 110 and a row address generator 112 respectively reset an output memory column address (COL) and memory row address (ROW) to 0 in response to an input RESET signal from BIST controller 100. Thereafter, during a test, column address generator 110 changes its output COL address in response to each pulse of a column address clock signal (COL CLOCK) from BIST controller 100. Similarly row address generator 112 changes its output ROW address in response to each pulse of a row address clock signal (ROW CLOCK) from BIST controller 100. Address generators 110 and 112 may be counters or may be pseudorandom number generators similar to generators 74 and 76 of FIG. 13.

A pair of filters 114 and 116 (similar to filters 78 and 80 of FIG. 13) filter the COL and ROW addresses to produce output column and row addresses (COL ADDR and ROW ADDR) supplied to a skewing circuit 120 (similar to skewing circuit 81 of FIG. 13). Filters 114 and 116 maintain the COL ADDR and ROW ADDR values within an address range determined by input MIN,MAX data supplied by BIST controller 100. In particular, whenever a COL or ROW value is within the indicated address range, filter 114 or 116 supplies the input COL or ROW value as its COL ADDR or ROW ADDR output. However when the COL or ROW value goes outside the indicated address range, filter 114 or 116 supplies as its COL ADDR or ROW ADDR output the last value of COL or ROW that was within the indicated address range. The MIN/MAX data may be shifted into filters 114, 116 of all core wrappers 102 via a serial bus.

A data decoder 118 acts as a lookup table to decode an encoded data word (ENCODED DATA) having a relatively few bits provided by BIST controller 100 to produce a wider output DATA word to be written into RAM 12 during a test. Since the range of DATA word patterns that may be written into memory 24 during a test may be small, only a relatively small ENCODED DATA word input to decoder 118 is needed to select a relatively large DATA word output. This helps minimize the number of signal paths between controller 100 and core wrappers 102 while still allowing controller 100 to control the sequence of data supplied to RAM 12.

The DATA value output of decoder 118 provides another input to skewing circuit 120. Skewing circuit 120, which also receives an input memory read/write control signal (or signals) CNT from BIST controller 100, suitably delays the CNT, COL ADDR, ROW ADDR and DATA signals to provide control (CNT), addressing input (ADDR) and data (DI) inputs to RAM 12 via multiplexers 42–44, controlled by a MODE signal from BIST controller 100. The CERR output of a comparator 52 which compares the RAM's input and output data is supplied as an input to BIST controller 100.

BIST controller 100 may be implemented, for example, in the form of a programmable gate array programmed by tester 21 or any other source of programming data (PROG) via a serial bus 106. BIST controller 100 may be programmed as a state machine to produce a sequence of output signal patterns on its output lines to core wrappers 102 that will cause core wrappers 102 to test RAM 12. Since BIST controller 100 is programmable, the nature of the signal patterns it produces and supplies to core wrappers 102 can be adjusted to suit the nature of the test to be performed on RAMs 12. Core wrappers 102 and BIST controller 102 can be used without hardware customization to accommodate a wide variety of sizes of RAMs 12 and to provide a variety of test patterns.

The manner in which the functions of core wrappers 102 and BIST controller 100 are partitioned ensures that only a relatively small number of control and data lines need be routed to several locations on IC 10 in order to test RAMS 12. This helps to minimize the amount of IC floor space the test system requires. The small control and data signal bus also permits much flexibility in where the control elements are physically located. BIST controller 100 can be easily moved off IC 10 because the connections to core wrappers 102 do not require the use of very many IC pins. Note that the test system architecture of FIG. 16 parallels that of FIG. 3B. FIG. 3B shows a BIST circuit 7 and a BIST controller 8 implemented within an integrated circuit 2B and these correspond to core wrapper 102 and BIST controller 100 implemented within integrated circuit 10 of FIG. 16. The data and control signal lines linking the core wrappers 102 to BIST controller 100 correspond to bus 4B of FIG. 3B. It should therefore be appreciated that BIST controller 100 can alternatively be implemented external to IC 10, for example on a load board on which the IC is mounted as illustrated in FIG. 3A. The function of BIST controller 100 can also be implemented by IC tester 21 providing a topology similar to that illustrated in FIG. 3C. Further, the function of a core wrapper 102 can be alternatively implemented by an externally mounted BOST circuit, providing a test circuit topology similar to that of FIG. 4.

We have described a test system for an integrated circuit having one or more embedded RAMs, wherein the test system includes a flexible BIST circuit for testing the RAMS, and wherein the BIST circuit may be incorporated with little customization into the IC regardless of the number, size or test requirements of its embedded RAMs. We have also described how a controller can configure the BIST circuit to accommodate the varying sizes of the embedded RAMs and to select from among several modes of BIST operation to accommodate the test requirements of each RAM. We have further shown how the controller functions may be conveniently and flexibly partitioned between a BIST controller inside the IC, a BOST controller outside the IC, and a conventional integrated circuit tester.

While the forgoing specification has described preferred embodiments of the present invention, one skilled in the art may make many modifications thereto without departing from the invention in its broader aspects. The appended claims are intended to cover all such modifications as fall within the true scope and spirit of the invention.

We claim:

1. An apparatus for testing a memory embedded in an integrated circuit (IC), wherein said memory includes a plurality of addressable memory cells and wherein said IC includes a logic circuit linked to said memory for read and write accessing said memory, the apparatus comprising:

a test circuit included in said IC for receiving input MIN, MAX data and for successively testing all memory cells of said memory having addresses within a range of addresses indicated by said input MIN, MAX data to determine whether each memory cell is defective, and control means for supplying said MIN, MAX data to said test circuit, and further comprising switch means included in said IC for responding to an input MODE signal by disconnecting said logic circuit from said memory and by connecting said test circuit to said memory so that said test circuit can test the memory cells of said memory, wherein said test circuit pulses an output CERR signal whenever it determines one of said memory cells is defective, wherein said test circuit continuously asserts an output FAIL signal after determining that any one of said memory cells is defective, wherein said control means supplies a DIAG signal to said test circuit to tell it test said memory in a bit map mode, wherein when said test circuit tests said memory other than in said bit map mode, it asserts a DONE signal when it has completed testing all memory cells of said memory, wherein when said test circuit tests said memory in said bit map mode it pulses said DONE signal when it completes testing any one memory cell of said memory and waits until it receives a READY signal from said control means before testing a next memory cell of said memory, wherein said control means monitors said DONE signal to determine when said test circuit has completed a test.

2. The apparatus in accordance with claim 1 wherein said control means comprises:

means internal to said IC for generating and supplying said MIN, MAX data and said DIAG signal to said test circuit, and means external to said IC for generating said READY signal and for monitoring said CERR, FAIL and DIAG signals.

3. The apparatus in accordance with claim 1 wherein said control means comprises:

a load board for holding said IC, and a built-off self test (BOST) circuit external to said IC mounted on said load board for generating and supplying said MIN, MAX data and said MODE, DIAG and READY signals to said test circuit and for monitoring said CERR, FAIL and DIAG signals.

4. The apparatus in accordance with claim 1 wherein said control means comprises:

a load board for holding said IC, and a built-off self test (BOST) circuit external to said IC mounted on said load board for generating and supplying said MIN, MAX data and said MODE and DIAG signals to said test circuit, and means external to said load board for generating said READY signal and for monitoring said CERR, FAIL and DIAG signals.

5. The apparatus in accordance with claim 1 wherein said control means comprises:

a load board for holding said IC, a built-off self test (BOST) circuit external to said IC mounted on said load board for generating and supplying said READY signal to said test circuit and for generating said READY signal and for monitoring said CERR, FAIL and DIAG signals, and means internal to said IC for generating and supplying said MIN, MAX data and said MODE and DIAG signals to said test circuit.

6. The apparatus in accordance with claim 1 further comprising:

a scan register implemented within said IC, and a scan bus linking said scan register to said control means, wherein said scan register stores data appearing at input and output ports of said memory in response to an input CAPTURE signal supplied to said scan register by said control means via said scan bus, wherein said scan register shifts out its stored data to said control means via said scan bus in response to pulses of a SHIFT signal supplied to said scan register by said control means via said scan bus, and wherein when the test circuit tests said memory in the bit map mode, said control means supplies said CAPTURE signal to said shift register and pulses said SHIFT signal in response to said DONE signal so that said scan register shifts out it stored data to said control means, said control means thereafter supplying said READY signal to said test circuit.

7. The apparatus in accordance with claim 6 wherein said test circuit generates RESULT data after testing each of said memory cells, said RESULT data indicating whether each bit of data written into that memory cell matches a corresponding bit of data it thereafter reads back out of that memory cell, wherein said scan register stores said RESULT data in response to an input CAPTURE signal supplied by said control means via said scan bus, and wherein said scan register also shifts out its stored RESULT data to said control means via said scan bus in response to pulses of said SHIFT signal.

8. The apparatus in accordance with claim 7 further comprising multiplexing means connected to said scan bus for responding to a FORCE signal supplied thereto by said control means via said scan bus by disconnecting a data output port (DO) of said memory from said logic circuit and supplying to said logic circuit said SCAN_INSERT data said control means stores in said scan register via said scan bus.

9. An apparatus for testing a memory embedded in an integrated circuit (IC), wherein said memory includes a plurality of addressable memory cells and wherein said IC includes a logic circuit linked to said memory for read and write accessing said memory, the apparatus comprising:

a test circuit included in said IC for successively testing all memory cells of said memory, pulsing an output CERR signal whenever it determines one of said memory cells is defective, and continuously asserting an output FAIL signal after determining that any one of said memory cells is defective, and wherein in response to a state of an input DIAG signal, said test circuit selectively either asserts a DONE signal when it has completed testing all of said memory cells or pulses said DONE signal each time it completes testing any one of said memory cells; and a control means for supplying said DIAG signal to said test circuit and for monitoring said DONE signal to determine when said test circuit has completed a test.

10. The apparatus in accordance with claim 9 further comprising:

a scan register implemented within said IC, and a scan bus linking said scan register to said control means, wherein said scan register stores data: appearing at input and output ports of said memory in response to an input CAPTURE signal supplied by said control means via said scan bus, wherein said scan register shifts out its stored data to said control means via said scan bus in response to pulses of a SHIFT signal supplied to said scan register by said control means via said scan bus.

11. The apparatus in accordance with claim 10 wherein said test circuit generates RESULT data after testing each of said memory cells, said RESULT data indicating whether each bit of data written into that memory cell matches a corresponding bit of data it thereafter reads back out of that memory cell, wherein said scan register stores said RESULT data in response to an input CAPTURE signal supplied by said control means via said scan bus, and wherein said scan register shifts out its stored RESULT data to said control means via said scan bus in response to pulses of a SHIFT signal supplied to said scan register by said control means via said scan bus.

12. An apparatus for testing a plurality of memories embedded in an integrated circuit (IC), wherein each of said memories includes a plurality of addressable memory cells, wherein at least two of said memories have differing address ranges, and wherein said IC includes logic circuits linked to said memories for read and write accessing said memories, the apparatus comprising:

a plurality of test circuits included in said IC, each corresponding to a separate one of said memories, for successively testing all memory cells of the corresponding memory having addresses within the corresponding memory's range of addresses as indicated by input MIN, MAX data to determine whether each memory cell is defective, control means for supplying said input MIN, MAX data to each of said test circuits, switch means included in said IC for responding to an input MODE signal by disconnecting said logic circuit from said memories and by connecting each said test circuit to its corresponding memory so that said test circuit can test the memory cells of its corresponding memory, wherein said control means also supplies said MODE control signal to said switch means, wherein each said test circuit pulses an output CERR signal whenever it determines one of said memory cells is defective and continuously asserts an output FAIL signal after determining that any one of said memory cells is defective, wherein said control means supplies a DIAG signal to each said test circuit, and wherein in response to a state of said DIAG signal, each said test circuit selectively either asserts an output DONE signal when it has completed testing all of said memory cells or pulses said DONE signal each time it completes testing any one of said memory cells.

13. The apparatus in accordance with claim 12 further comprising a glue logic circuit for processing output DONE signals of all of said test circuits to provide a single DONEX signal provided as input to said control means, for processing output FAIL signals of all of said test circuits to produce a single FAILX signal provided as input to said control means, and for delivering one of said output CERR signals of said test circuits as input to said control means.

14. An apparatus for testing a plurality of memories embedded in an integrated circuit (IC), wherein each memory includes a plurality of addressable memory cells and wherein said IC includes logic circuits linked to said memory for read and write accessing said memory, the apparatus comprising:

a plurality of test circuits included in said IC, each corresponding to a separate one of said Memories, for successively testing all memory cells of the corresponding memory, pulsing an output CERR signal whenever it determines one of said memory cells is defective, and continuously asserting an output FAIL signal after determining that any one of said memory cells is defective, and wherein in response to a state of an input DIAG signal, said test circuit selectively either asserts a DONE signal when it has completed testing all of said memory cells or pulses said DONE signal each time it completes testing any one of said memory cells;

glue logic,means for processing the DONE signal output of all of said test circuits to produce a single DONEX output signal, for processing the CERR output signals of all of said test circuits to produce a single CERRX output signal, and for processing the FAIL output signals of all of said test circuits to produce a single FAILX output signal, control means for supplying said DIAG signal to said test circuit and for monitoring said, CERRX, FAILX and DONEX.

15. The apparatus in accordance with claim 14 further comprising:

a plurality of scan register implemented within said IC, each scan register corresponding to a separate one of said memories, and a scan bus linking said scan registers to said control means, wherein each test circuit generates RESULT data after testing any memory cell its corresponding memory, said RESULT data indicating whether each bit of data written into that memory cell matches a corresponding bit of data it thereafter reads back out of that memory cell, wherein said scan register stores said RESULT data in response to an input CAPTURE signal supplied by said control means via said scan bus, and wherein said scan register shifts out its stored RESULT data to said control means via said scan bus in response to pulses of a SHIFT signal supplied to said scan register by said control means via said scan bus.

16. The apparatus in accordance with claim 15 wherein each scan register stores also data appearing at input and output ports of its corresponding memory in response to said CAPTURE signal.

* * * * *